(12) United States Patent
Fujimoto et al.

(10) Patent No.: US 12,156,398 B2
(45) Date of Patent: Nov. 26, 2024

(54) SEMICONDUCTOR DEVICE HAVING WORD LINE EMBEDDED IN GATE TRENCH

(71) Applicant: MICRON TECHNOLOGY, INC., Boise, ID (US)

(72) Inventors: Toshiyasu Fujimoto, Higashihiroshima (JP); Yoshihiro Matsumoto, Kobe (JP)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 17/549,494

(22) Filed: Dec. 13, 2021

(65) Prior Publication Data

US 2023/0189502 A1    Jun. 15, 2023

(51) Int. Cl.
    *H10B 12/00*        (2023.01)
    *H01L 29/66*        (2006.01)
    *H01L 29/786*      (2006.01)

(52) U.S. Cl.
    CPC ....... *H10B 12/315* (2023.02); *H01L 29/6675* (2013.01); *H01L 29/78618* (2013.01); *H01L 29/78672* (2013.01); *H10B 12/02* (2023.02)

(58) Field of Classification Search
    CPC ......... H01L 21/76829; H01L 21/76877; H01L 29/945; H01L 21/76831; H01L 29/4236; H10B 12/34; H10B 12/053; H10B 12/0387; H10B 12/315; H10B 12/02
See application file for complete search history.

(56) References Cited

U.S. PATENT DOCUMENTS

| | | | | |
|---|---|---|---|---|
| 2010/0044787 A1* | 2/2010 | Sugioka | ............... | H10B 12/056 438/270 |
| 2013/0062679 A1* | 3/2013 | Manabe | .................. | H01L 29/94 257/306 |
| 2020/0105765 A1* | 4/2020 | Kim | .................. | H01L 29/42368 |
| 2021/0398588 A1* | 12/2021 | Wang | ..................... | H10B 10/12 |
| 2022/0165886 A1* | 5/2022 | Long | ................ | H01L 21/32132 |
| 2023/0120621 A1* | 4/2023 | Yang | ..................... | H10B 43/27 257/314 |

FOREIGN PATENT DOCUMENTS

ES            1078649 U    *    2/2013

OTHER PUBLICATIONS

U.S. Appl. No. 18/051,690, titled "Semiconductor Device Having Word Line Embedded in Gate Trench", filed Nov. 1, 2022.

* cited by examiner

*Primary Examiner* — Edward Chin
(74) *Attorney, Agent, or Firm* — Dorsey & Whitney LLP

(57) ABSTRACT

Disclosed herein is an apparatus that includes a semiconductor substrate having source/drain regions and a gate trench located between the source/drain regions; and a gate electrode embedded in the gate trench via a gate insulating film. The gate electrode includes a first polycrystalline silicon film located at a bottom of the gate trench and a metal film stacked on the first polycrystalline silicon film. The first polycrystalline silicon film is doped with boron.

10 Claims, 12 Drawing Sheets

SEMICONDUCTOR DEVICE HAVING WORD LINE EMBEDDED IN GATE TRENCH

BACKGROUND

Some cell transistors used in a semiconductor memory device such as a DRAM have a configuration in which a gate electrode containing a metal material is embedded in a gate trench. GIDL of a cell transistor has been a problem in recent years and it is required to be reduced.

BRIEF DESCRIPTION OF THE DRAWINGS

FIGS. 5A to 12A are schematic plan views for explaining a manufacturing process of the semiconductor memory device according to an embodiment of the present disclosure;

FIGS. 5B to 12B are schematic sectional views along with a line B-B respectively shown in FIGS. 5A to 12A; and FIGS. 5C to 12C are schematic sectional views along with a line C-C respectively shown in FIGS. 5A to 12A.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
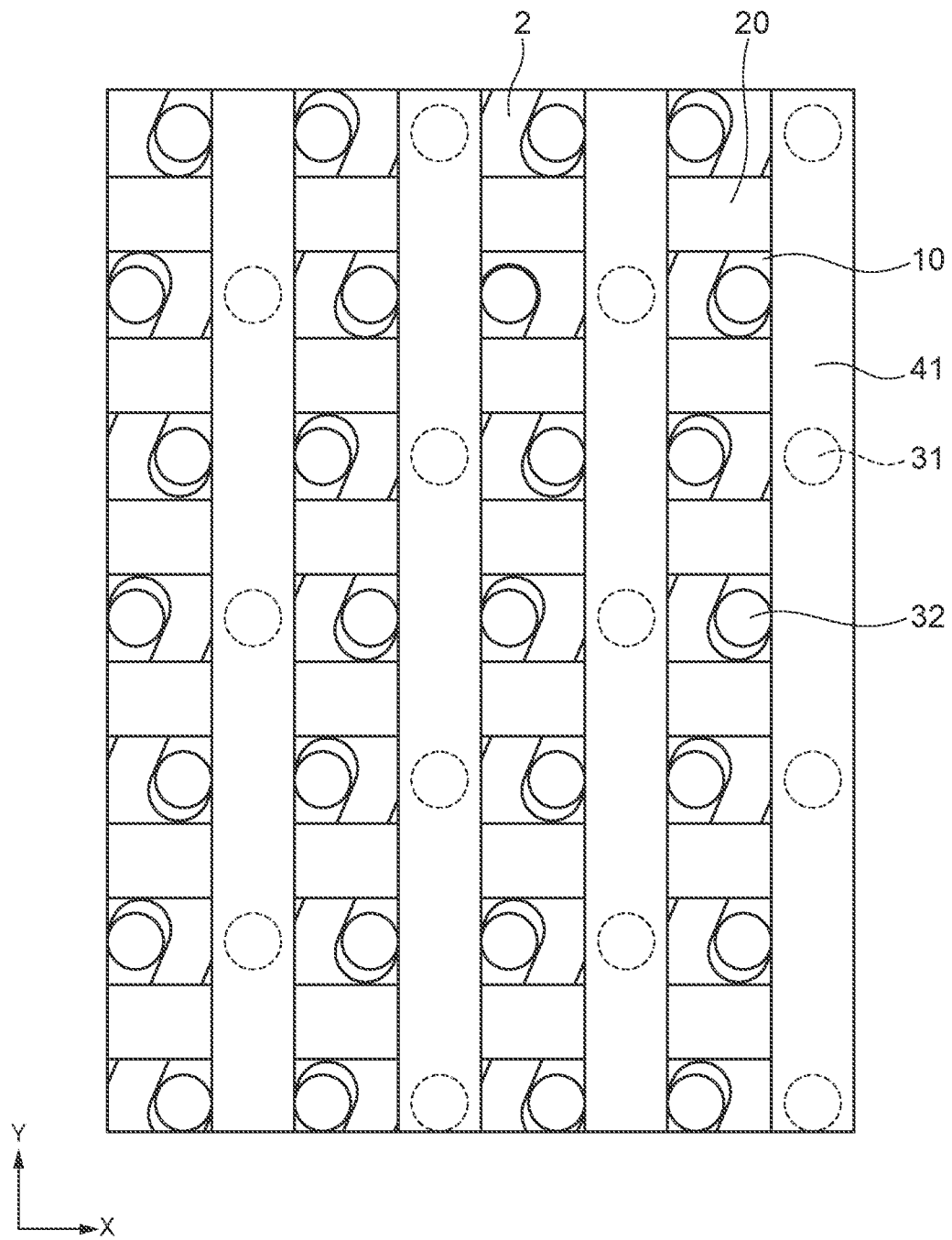
FIG. 1 is a schematic plan view showing a portion of a semiconductor memory device according to an embodiment of the present disclosure.
Figure 2:
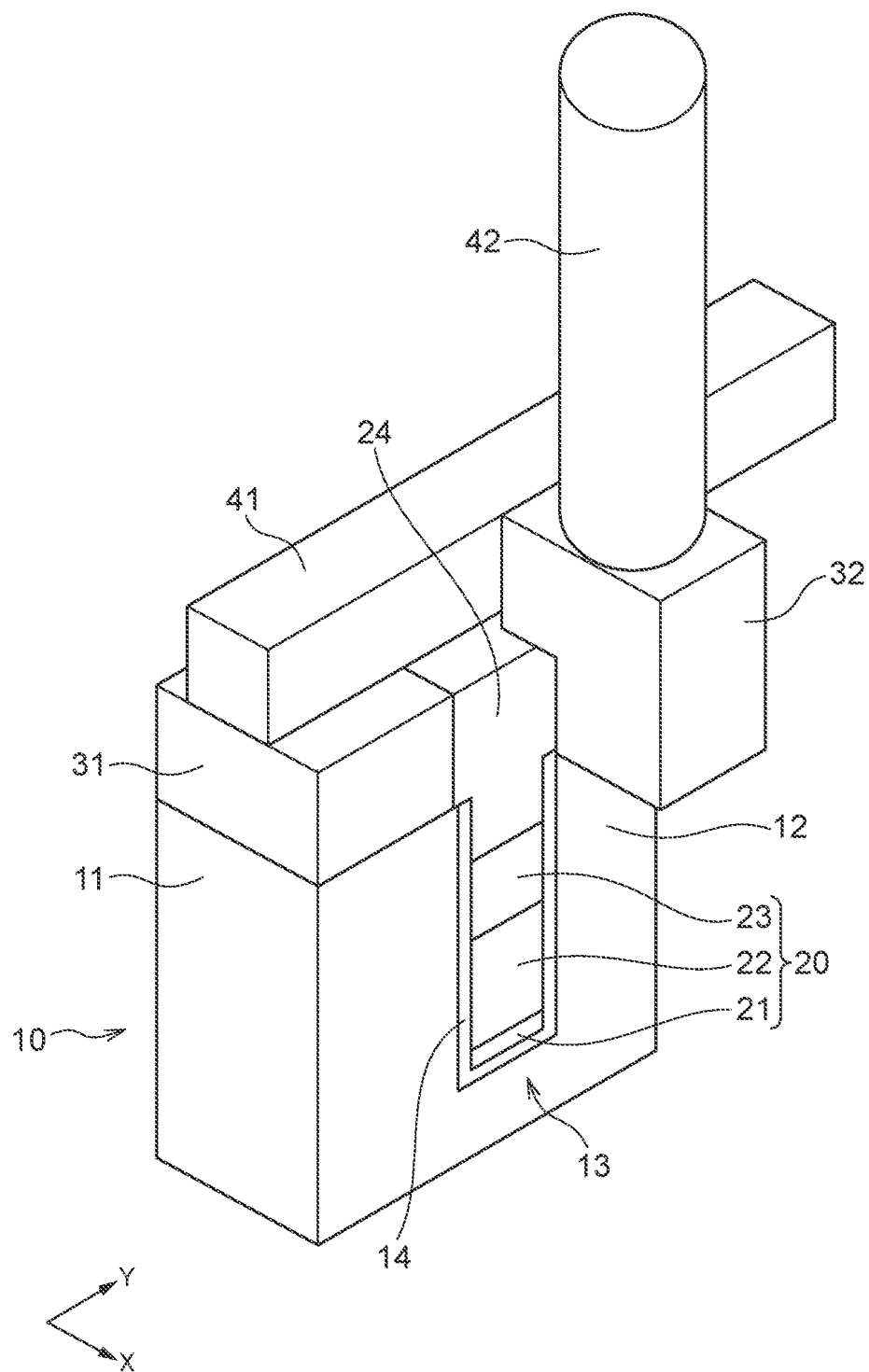
FIG. 2 is a schematic perspective view showing a portion of the semiconductor memory device according to an embodiment of the present disclosure.

FIGS. 1 and 2 are a schematic plan view and a schematic perspective view showing a portion of a semiconductor memory device according to an embodiment of the present disclosure, respectively. The semiconductor memory device according to the present disclosure is a DRAM and includes a plurality of active regions 10 partitioned by an STI region 2, a plurality of word lines 20 that cross the active regions 10 in the X-direction, and a plurality of bit lines 41 that cross the active regions 10 in the Y-direction. The active region 10 is a portion of a semiconductor substrate. Two of the word lines 20 cross each of the active regions 10 in the X-direction. In this manner, each active region 10 is divided into three source/drain regions. A center source/drain region is connected to a corresponding one of the bit lines 41 through a bit contact 31. Two of the source/drain regions located on both sides are connected to corresponding cell capacitors 42 through cell contacts 32, respectively.

As shown in FIG. 2, a gate trench 13 is formed in the active region 10 to extend in the X-direction. Source/drain regions 11 and 12 are provided on both sides of the gate trench 13 in the Y-direction. The inner wall of the gate trench 13 is covered with a gate insulating film 14 made of, for example, silicon oxide. The word line 20 serving as a gate electrode is embedded in the gate trench 13 via the gate insulating film 14. The word line 20 is formed by a polycrystalline silicon film 21 located at the bottom of the gate trench 13, a metal film 22 stacked on the polycrystalline silicon film 21, and a polycrystalline silicon film 23 stacked on the metal film 22. A gate cap insulating film 24 made of, for example, silicon nitride is provided above the polycrystalline silicon film 23. The polycrystalline silicon film 21 is doped with boron, and therefore the conductive type thereof is a P-type. Meanwhile, the polycrystalline silicon film 23 is doped with phosphorus, and therefore the conductive type thereof is an N-type. The metal film 22 is made of, for example, titanium nitride. With this configuration, a channel is formed around the gate trench 13 when a predetermined ON potential is applied to the word line 20, so that the source/drain regions 11 and 12 are electrically connected to each other.

The work function of the material of the polycrystalline silicon film 23 is about 4.1, and thus the polycrystalline silicon film 23 relaxes an electric field applied to an upper region of the channel to reduce GIDL. Consequently, an off-leakage current is reduced, resulting in improvement of refresh characteristics. Further, the metal film 22 makes the resistance of the word line 20 low. The work function of the material of the metal film 22 is about 4.5 to about 4.7. Therefore, the metal film 22 prevents excessive drop of a threshold voltage of a cell transistor to reduce the off-leakage current. The work function of the material of the polycrystalline silicon film 21 is about 5.2. Therefore, the polycrystalline silicon film 21 relaxes an electric field applied to a lower region of the channel to reduce the GIDL. As described above, the polycrystalline silicon film 21 having a large work function is located at the bottom of the gate trench 13, the metal film 22 having a smaller work function and a lower resistance value than the polycrystalline silicon film 21 is located on the polycrystalline silicon film 21, and the polycrystalline silicon film 23 having a smaller work function than the metal film 22 is located on the metal film 22 in the present embodiment. Therefore, it is possible to make the resistance of the work line 20 low and reduce an off-leakage current of a cell transistor. It is preferable that the polycrystalline silicon film 23 is thicker than the polycrystalline silicon film 21 and the metal silicon film 22 is thicker than the polycrystalline silicon film 23 in order to sufficiently obtain the effects described above. The thickness of the polycrystalline silicon film 21 can be set to about 15 nm.

Figure 3:
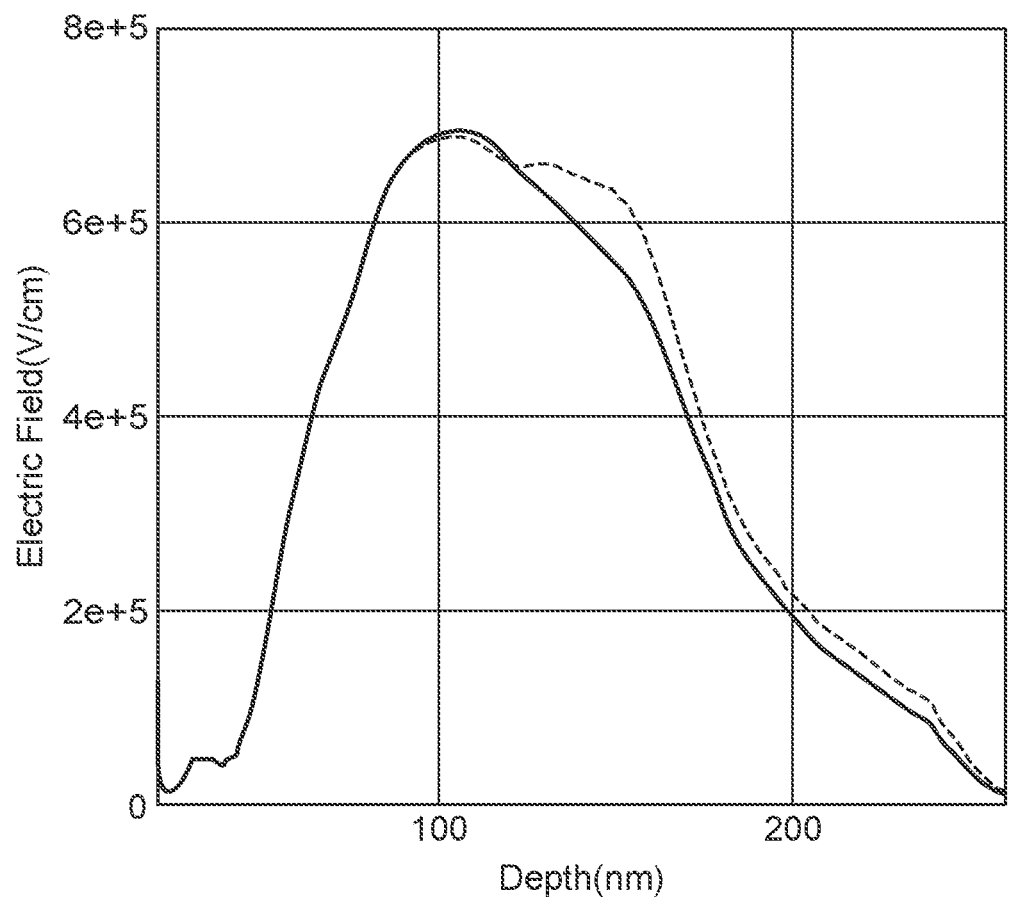
FIG. 3 is a graph representing a relationship between the depth of a channel and an electric field.
Figure 4A:
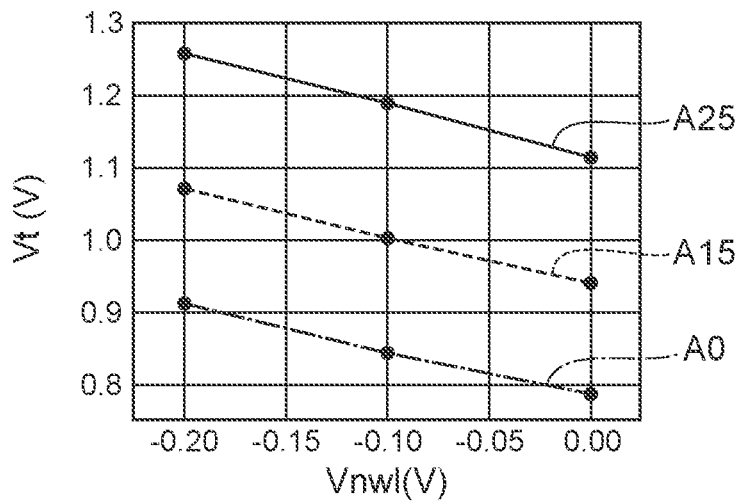
FIGS. 4A to 4C are graphs representing relationships among a potential of a word line when a cell transistor is off and a threshold voltage, an ON current, and a charge gain associated with turning on and off of an adjacent word line.
Figure 4B:
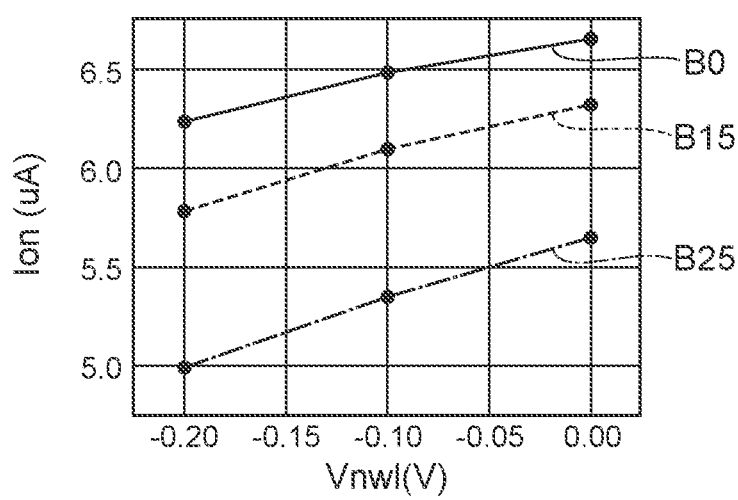
Figure 4C:
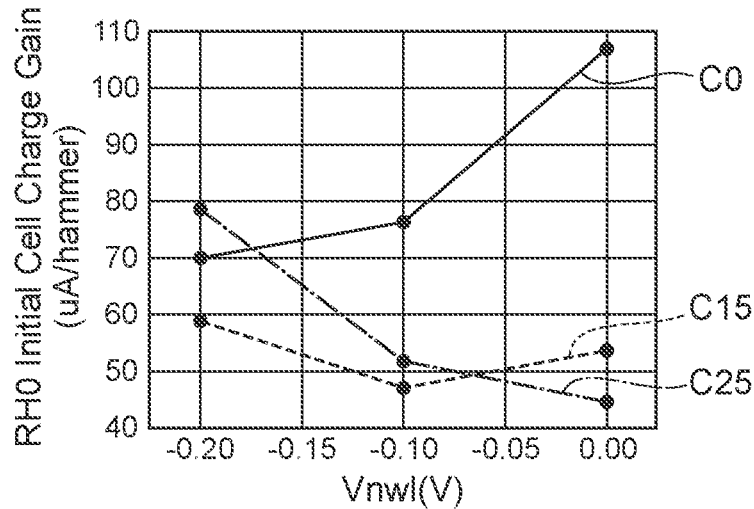

FIG. 3 shows a graph of a relation between the depth of a channel and an electric field. In FIG. 3, a solid line represents the characteristics in an embodiment of the present embodiment, and a broken line represents the characteristics in a case where the polycrystalline silicon film 21 is omitted. It is found from FIG. 3 that an electric field is relaxed at a depth of 120 nm or more in the present embodiment. FIGS. 4A to 4C show graphs of relations among a potential Vnwl of the word line 20 when a cell transistor is off and a threshold voltage Vt, an ON current Ion, and a charge gain associated with turning on and off of an adjacent word line 20. In FIGS. 4A to 4C, reference signs A0, B0, and C0 represent the characteristics in a case where the thickness of the polycrystalline silicon film 21 is zero, reference signs A15, B15, and C15 represent the characteristics in a case where the thickness of the polycrystalline silicon film 21 is 15 nm, and reference signs A25, B25, and C25 represent the characteristics in a case where the thickness of the polycrystalline silicon film 21 is 25 nm. As shown in FIG. 4A, the threshold voltage Vt of the cell transistor tends to be increased by providing the polycrystalline silicon film 21. Therefore, in order to lower the threshold voltage Vt while the polycrystalline silicon film 21 is provided, the potential Vnwl of the word line 20 when the cell transistor is off is to be made closer to 0 V. As shown in FIG. 4B, the ON current Ion of the cell transistor tends to be reduced by providing the polycrystalline silicon film 21. Therefore, in order to obtain the sufficient ON current Ion while the polycrystalline silicon film 21 is provided, the potential Vnwl of the word line 20 when the cell transistor is off is to be made closer to 0 V. When the potential Vnwl of the word line 20 when the cell transistor is off is made closer to 0 V, the charge gain associated with turning on and off of the adjacent word line 20 is largely reduced as compared with a case where the polycrystalline silicon film 21 is not provided, as shown in FIG. 4C. Accordingly, the row hammer characteristics are largely improved.

Figure 5A:
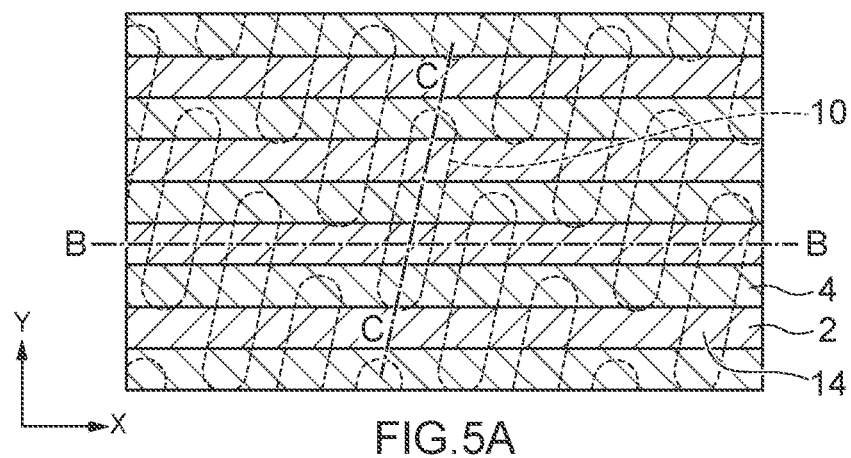
Figure 5B:
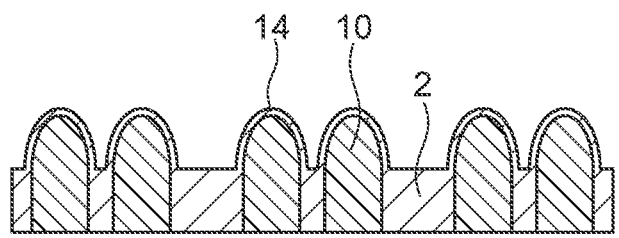
Figure 5C:
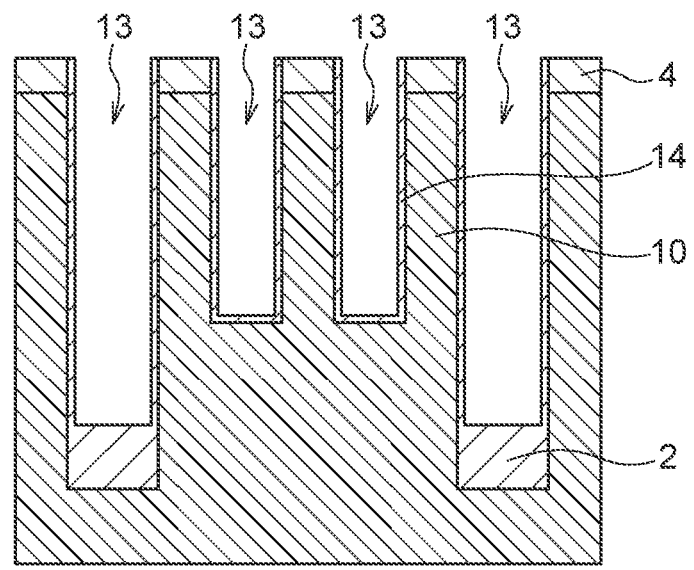
Figure 6A:
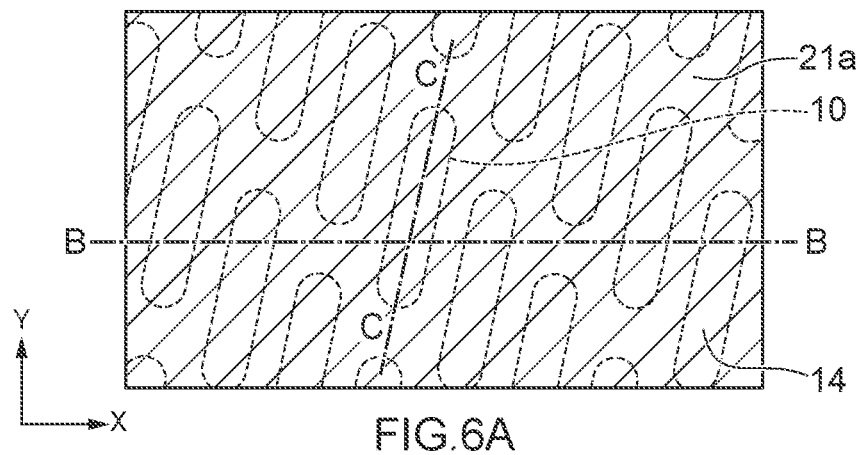
Figure 6B:
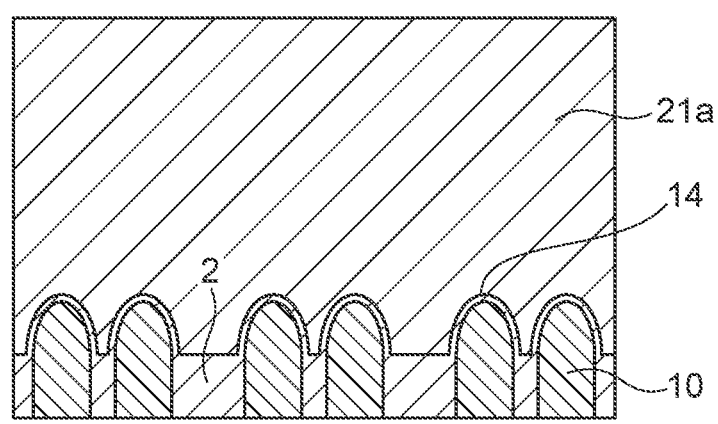
Figure 6C:
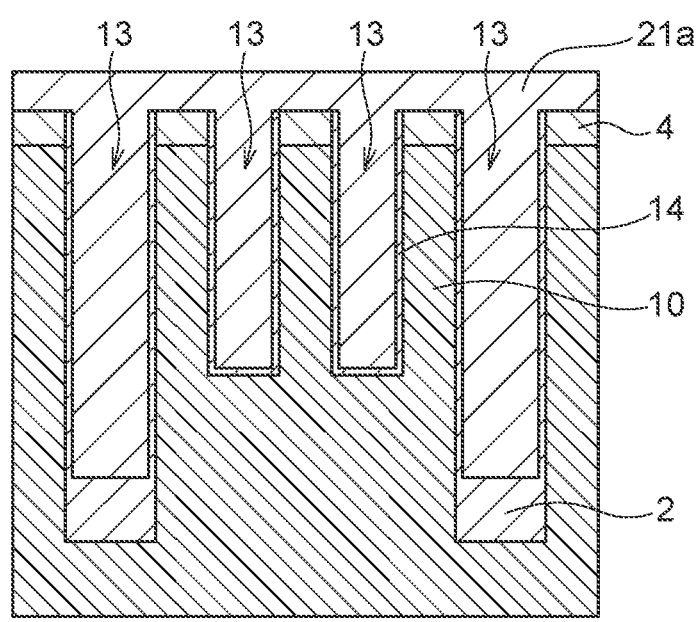
Figure 7A:
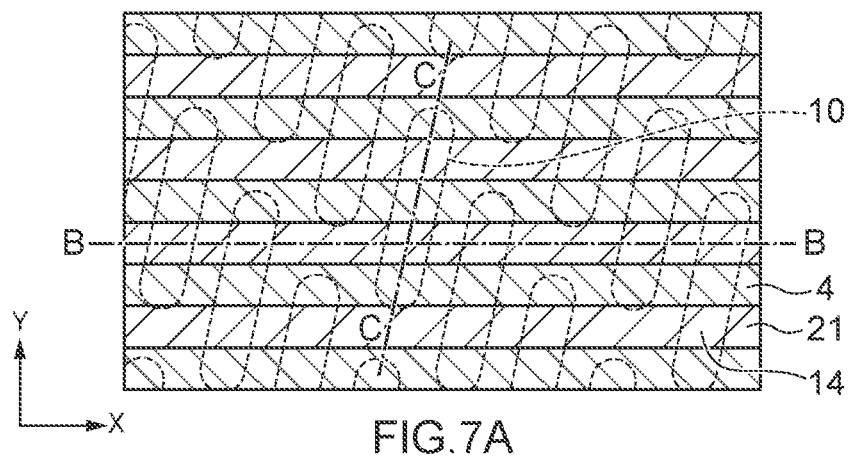
Figure 7B:
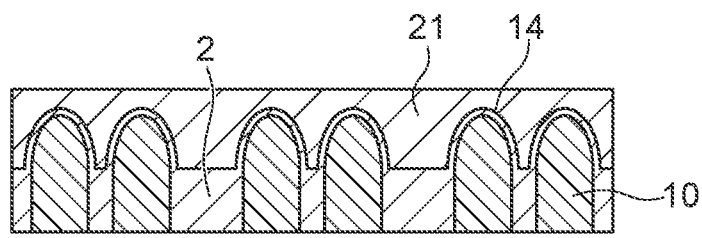
Figure 7C:
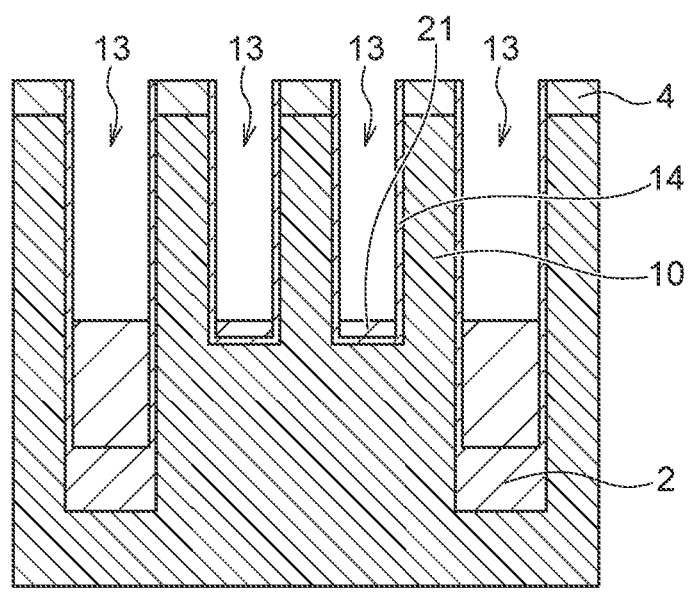

Next, a manufacturing process of the semiconductor memory device according to an embodiment of the present disclosure is described. First, as shown in FIGS. 5A to 5C, the active regions 10 are formed by etching a semiconductor substrate using hard mask 4 made of, for example, silicon oxide, and then a space between the active regions 10 is embedded with the STI region 2 made of, for example, silicon oxide. Subsequently, the gate trenches 13 extending in the X-direction are formed. Two of the gate trenches 13 are assigned to each active region 10. Next, the gate insulating film 14 made of silicon oxide is formed on the inner wall of the gate trench 13 by thermal oxidation. Subsequently, as shown in FIGS. 6A to 6C, a boron-doped polycrystalline silicon film 21a is deposited on the entire surface, whereby the gate trench 13 is embedded with the boron-doped polycrystalline silicon film 21a. As shown in FIGS. 7A to 7C, the boron-doped polycrystalline silicon film 21a is then etched back, so that the polycrystalline silicon film 21 is made to remain at the bottom of the gate trench 13 crossing the active region 10. The thickness of the remaining polycrystalline silicon film 21 is controlled to be about 15 nm.

Figure 8A:
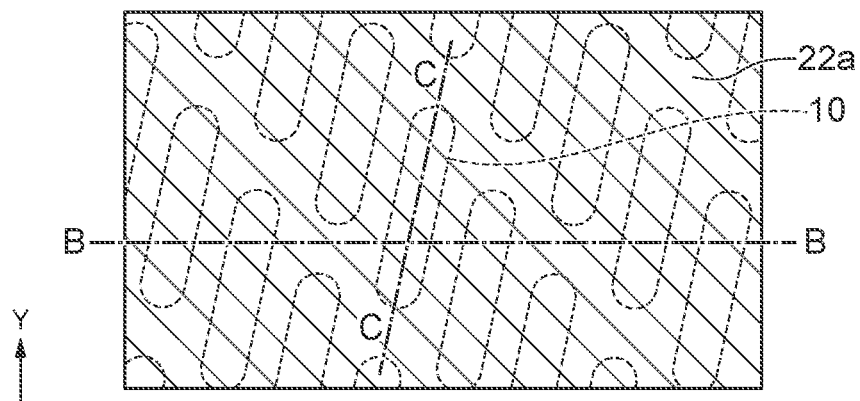
Figure 8B:
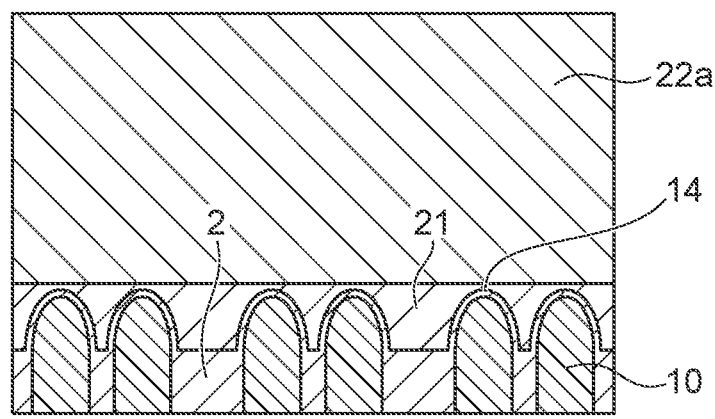
Figure 8C:
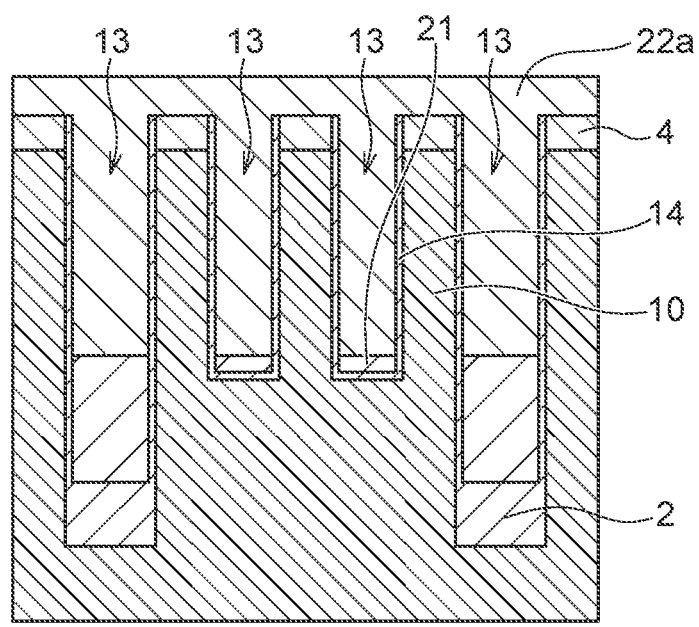
Figure 9A:
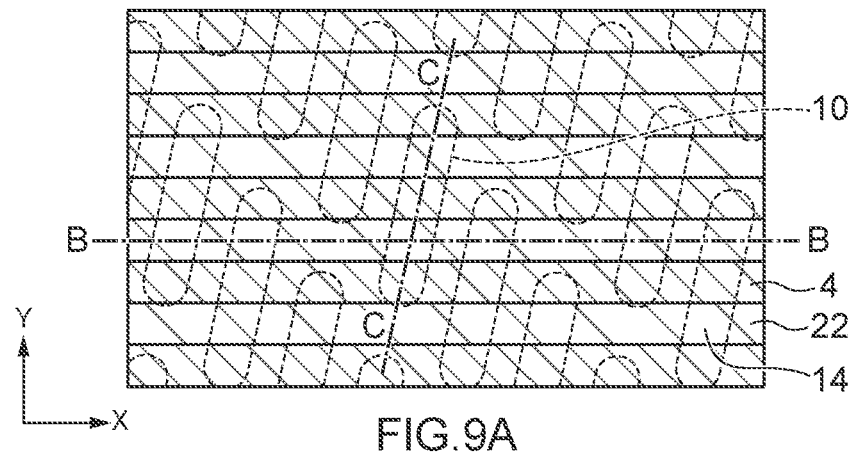
Figure 9B:
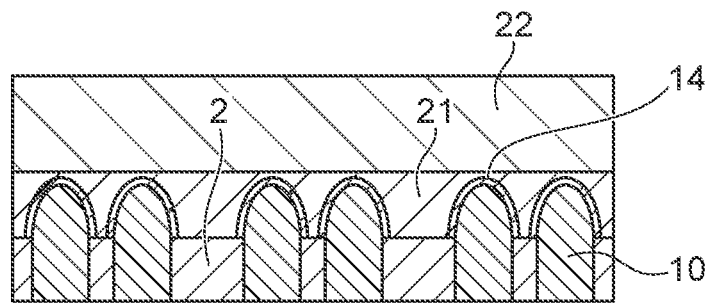
Figure 9C:
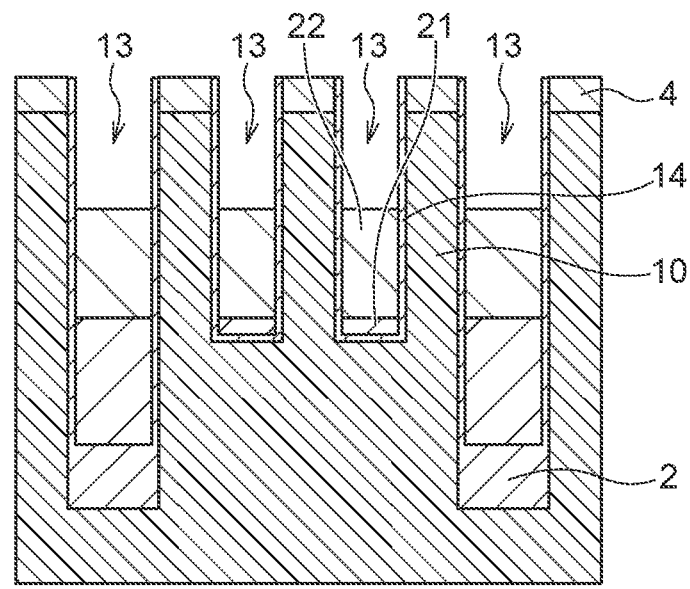
Figure 10A:
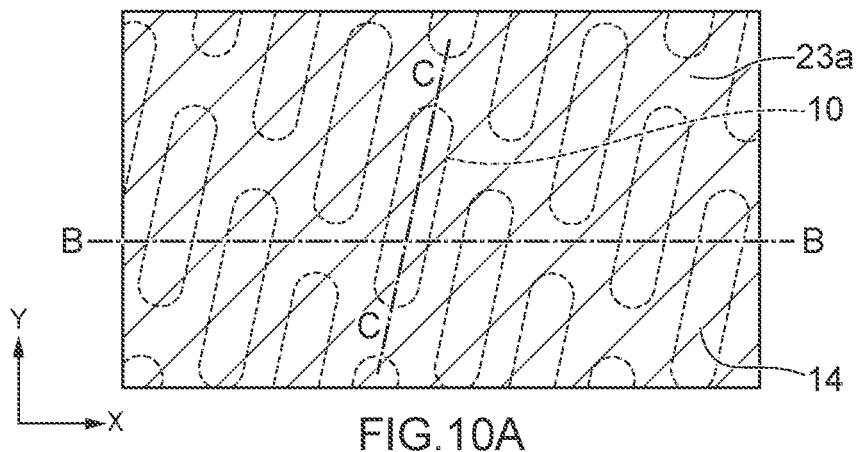
Figure 10B:
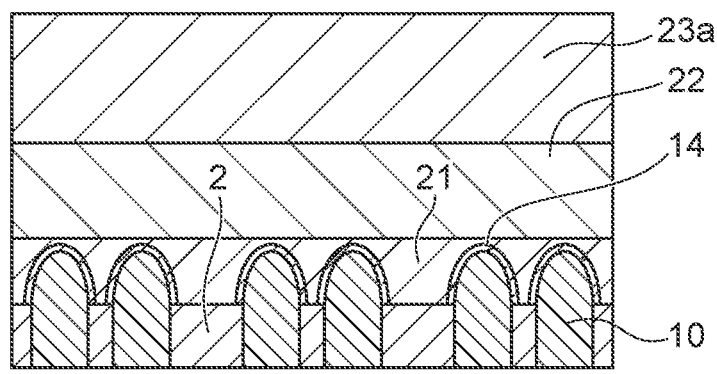
Figure 10C:
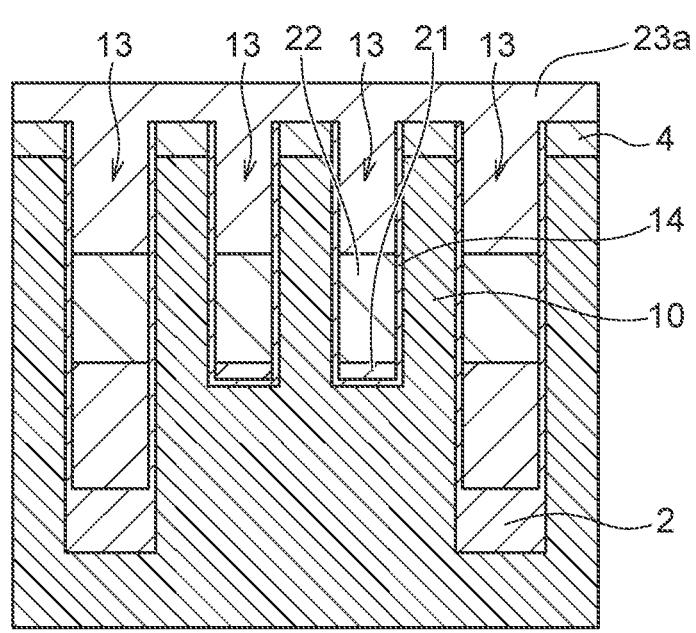
Figure 11A:
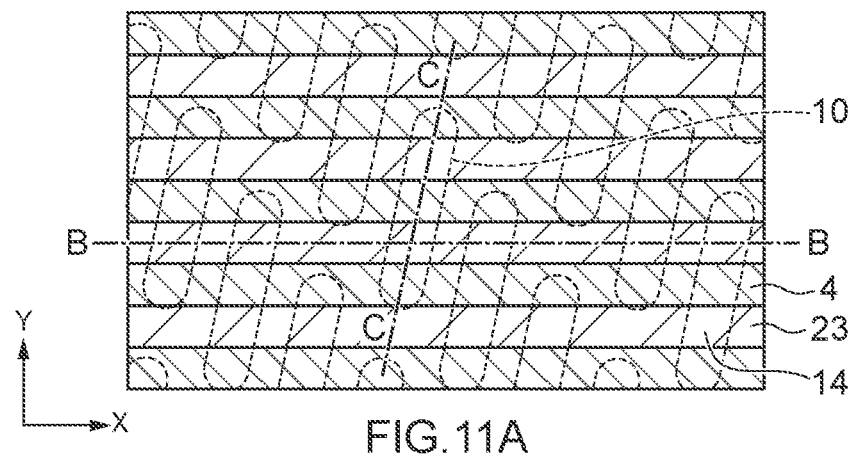
Figure 11B:
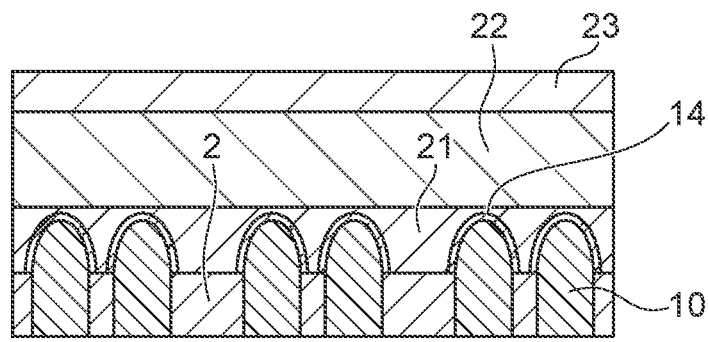
Figure 11C:
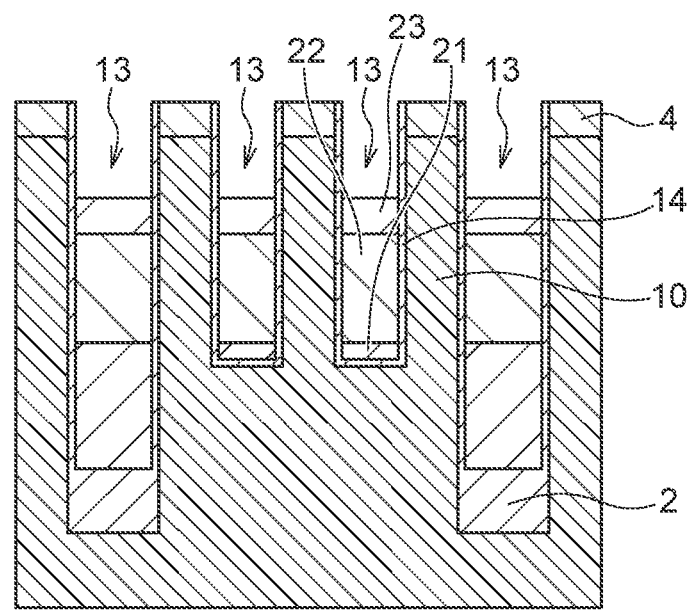
Figure 12A:
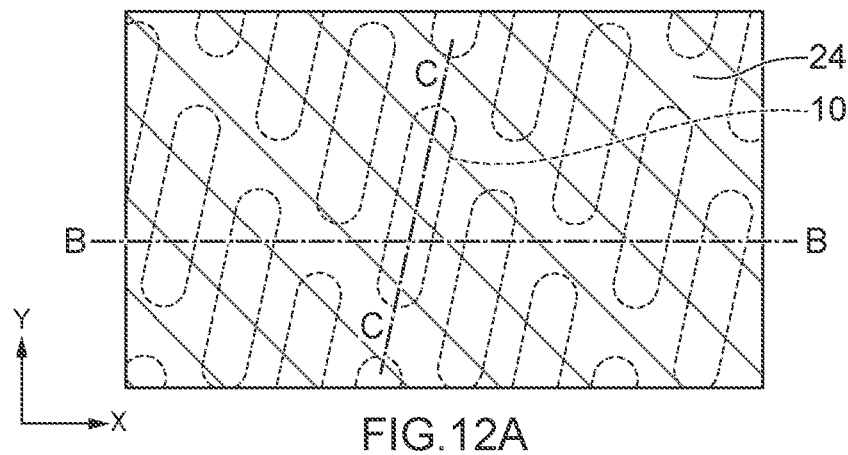
Figure 12B:
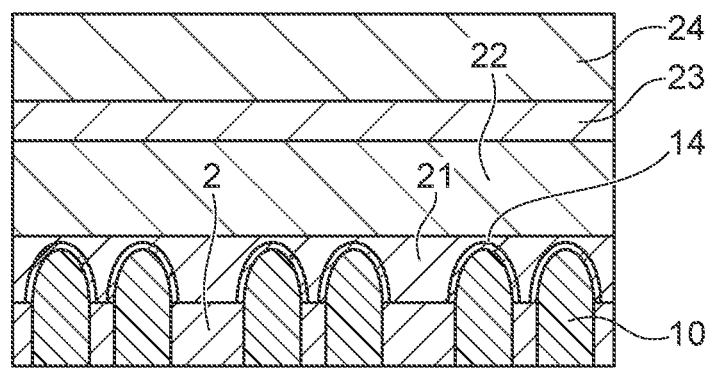
Figure 12C:
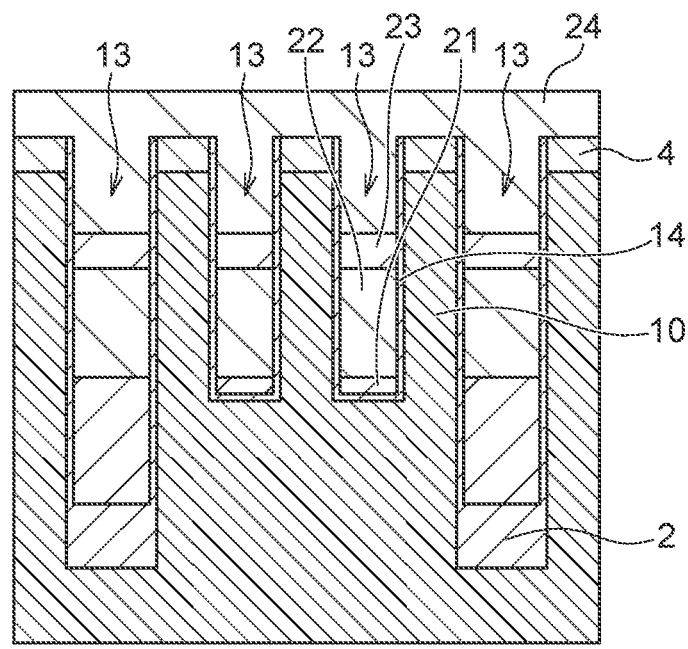

Next, as shown in FIGS. 8A to 8C, a metal film 22a made of, for example, titanium nitride is deposited on the entire surface, whereby the gate trench 13 is embedded with the metal film 22a. The metal film 22a is then etched back, so that the metal film 22 is made to remain on the polycrystalline silicon film 21 located at the bottom of the gate trench 13, as shown in FIG. 9A to 9C. Subsequently, as shown in FIGS. 10A to 10C, a phosphorus-doped polycrystalline silicon film 23a is deposited on the entire surface, whereby the gate trench 13 is embedded with the phosphorus-doped polycrystalline silicon film 23a. The phosphorus-doped polycrystalline silicon film 23a is then etched back, so that the polycrystalline silicon film 23 is made to remain on the metal film 22 in the gate trench 13, as shown in FIGS. 11A to 11C. Next, as shown in FIGS. 12A to 12C, the gate cap insulating film 24 made of, for example, silicon nitride is deposited on the entire surface, whereby the gate trench 13 is completely embedded. Thereafter, formation of the bit contact 31 and the cell contact 32, formation of the bit line 41, formation of the cell capacitor 42, and the like are sequentially performed. In this manner, the semiconductor memory device according to the present embodiment is completed.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

The invention claimed is:

1. An apparatus, comprising:
    a semiconductor substrate having source/drain regions and a gate trench located between the source/drain regions; and
    a gate electrode embedded in the gate trench via a gate insulating film, wherein an inner wall of the gate trench is covered with the gate insulating film and the gate electrode is embedded in the covered gate trench,
    wherein the gate electrode includes, in the covered gate trench, a first polycrystalline silicon film located at a bottom of the covered gate trench, a metal film on an upper surface of the first polycrystalline silicon film, and a second polycrystalline silicon film on an upper surface of the metal film, and
    wherein the first polycrystalline silicon film is doped with boron, and the second polycrystalline silicon film is doped with phosphorus.

2. The apparatus of claim 1, wherein the metal film comprises titanium nitride.

3. The apparatus of claim 1, wherein the first polycrystalline silicon film is thinner than the metal film.

4. The apparatus of claim 3, wherein the first polycrystalline silicon film is thinner than the second polycrystalline silicon film.

5. The apparatus of claim 4, wherein the second polycrystalline silicon film is thinner than the metal film.

6. The apparatus of claim 1, further comprising:
    a bit line coupled to one of the source/drain regions; and
    a cell capacitor coupled to the other of the source/drain regions.

7. An apparatus, comprising:
    a semiconductor substrate having source/drain regions and a gate trench located between the source/drain regions; and
    a gate electrode embedded in the gate trench via a gate insulating film, wherein an inner wall of the gate trench is covered with the gate insulating film and the gate electrode is embedded in the covered gate trench,
    wherein the gate electrode includes, in the covered gate trench, a first conductive film located at a bottom of the covered gate trench, a second conductive film on an upper surface of the first conductive film, and a third conductive film on an upper surface of the second conductive film, and
    wherein the second conductive film is lower in work function than the first conductive film and higher in work function than the third conductive film, and wherein the first and third conductive films comprise polycrystalline silicon doped with different impurities from each other, and the second conductive film comprises metal material.

8. The apparatus of claim 7, wherein the second conductive film comprises titanium nitride.

9. The apparatus of claim 7, wherein the first conductive film is doped with boron.

10. The apparatus of claim 9, wherein the third conductive film is doped with phosphorus.

* * * * *